(12) United States Patent
Tao et al.

(10) Patent No.: US 9,508,856 B2
(45) Date of Patent: Nov. 29, 2016

(54) THIN FILM TRANSISTOR

(71) Applicants: KABUSHIKI KAISHA KOBE SEIKO SHO (KOBE STEEL, LTD.), Kobe-shi (JP); Samsung Display Co., Ltd., Yongin (KR)

(72) Inventors: Hiroaki Tao, Kobe (JP); Takeaki Maeda, Kobe (JP); Aya Miki, Kobe (JP); Toshihiro Kugimiya, Kobe (JP); Byung Du Ahn, Hwaseong (KR); So Young Koo, Yongin (KR); Gun Hee Kim, Asan (KR)

(73) Assignees: Kobe Steel, Ltd., Kobe-shi (JP); Samsung Display Co., Ltd., Yongin (KR)

(*) Notice: Subject to any disclaimer, the term of this patent is extended or adjusted under 35 U.S.C. 154(b) by 0 days.

(21) Appl. No.: 14/436,241

(22) PCT Filed: Oct. 15, 2013

(86) PCT No.: PCT/JP2013/077913
§ 371 (c)(1),
(2) Date: Apr. 16, 2015

(87) PCT Pub. No.: WO2014/061638
PCT Pub. Date: Apr. 24, 2014

(65) Prior Publication Data
US 2015/0249159 A1 Sep. 3, 2015

(30) Foreign Application Priority Data
Oct. 19, 2012 (JP) ................................ 2012-231805

(51) Int. Cl.
*H01L 29/786* (2006.01)

(52) U.S. Cl.
CPC ..... *H01L 29/78606* (2013.01); *H01L 29/7869* (2013.01); *H01L 29/78693* (2013.01)

(58) Field of Classification Search
CPC ................ H01L 29/78606; H01L 29/78693; H01L 29/7869
See application file for complete search history.

(56) References Cited

U.S. PATENT DOCUMENTS 8,531,870 B2 * 9/2013 Koyama ............... G11C 11/405
365/104
2009/0127551 A1 5/2009 Imai
(Continued)

FOREIGN PATENT DOCUMENTS

JP 2008-243928 A 10/2008
JP 2009-141342 A 6/2009
(Continued)

OTHER PUBLICATIONS

Solid Physics, vol. 44, No. 9, 2009, pp. 620-633 (corresponds to Japanese Journal of Applied Physics, vol. 45, No. 5B, 2006, pp. 4303-4308).
(Continued)

*Primary Examiner* — David Vu
(74) *Attorney, Agent, or Firm* — Oblon, McClelland, Maier & Neustadt, L.L.P.

(57) ABSTRACT

Provided is a thin film transistor wherein the shape of a protrusion formed on the interface between an oxide semiconductor layer and a protection film is suitably controlled, and stable characteristics are achieved. This thin film transistor is characterized in that: the thin film transistor has an oxide semiconductor layer formed of an oxide containing at least In, Zn and Sn as metal elements, and a protection film directly in contact with the oxide semiconductor layer; and the maximum height of a protrusion formed on the oxide semiconductor layer surface directly in contact with the protection film is less than 5 nm.

6 Claims, 3 Drawing Sheets

(56) References Cited

U.S. PATENT DOCUMENTS

| | | |
|---|---|---|
| 2010/0155717 A1 | 6/2010 | Yano et al. |
| 2010/0213459 A1 | 8/2010 | Shimada et al. |
| 2010/0276685 A1 | 11/2010 | Itagaki et al. |
| 2012/0132911 A1 | 5/2012 | Shimada et al. |
| 2012/0211745 A1 | 8/2012 | Ueda et al. |
| 2013/0240802 A1 | 9/2013 | Miki et al. |
| 2013/0248855 A1 | 9/2013 | Miki et al. |
| 2013/0248858 A1 | 9/2013 | Morita et al. |
| 2013/0334039 A1 | 12/2013 | Goto et al. |
| 2013/0341183 A1 | 12/2013 | Goto et al. |
| 2014/0054588 A1 | 2/2014 | Maeda et al. |
| 2014/0319512 A1 | 10/2014 | Maeda et al. |
| 2015/0076489 A1 | 3/2015 | Morita et al. |

FOREIGN PATENT DOCUMENTS

| | | |
|---|---|---|
| JP | 2009-164393 A | 7/2009 |
| JP | 2010-177431 A | 8/2010 |
| JP | 2010-186860 A | 8/2010 |
| JP | 2011-146724 A | 7/2011 |
| JP | 2012-38891 A | 2/2012 |
| JP | 2012-104639 | 5/2012 |
| JP | 2012-186383 A | 9/2012 |
| WO | WO 2011/027467 A1 | 3/2011 |

OTHER PUBLICATIONS

Kenji Nomura, et al., "Amorphous Oxide Semiconductors for High-Performance Flexible Thin-Film Transistors" Japanese Journal of Applied Physics, vol. 45, No. 5B, 2006, pp. 4303-4308.

Kenji Nomura, et al., "Room-temperature fabrication of transparent flexible thin-film transistors using amorphous oxide semiconductors" Nature, vol. 432, Nov. 25, 2004, pp. 488-492.

Min Ki Ryu, et al., "High performance thin film transistor with cosputtered amorphous Zn—In—Sn—O channel: Combinatorial approach" Applied Physics Letters, vol. 95, 2009, pp. 072104-1-072104-3.

Eri Fukumoto, et al., "High Mobility Oxide Semiconductor TFT for Circuit Integration of AM-OLED" The Proceedings of the 17$^{th}$ International Display Workshops (IDW' 10), AMD5/OLED6-2, 2010, pp. 631-634.

International Search Report issued Dec. 17, 2013 in PCT/JP2013/077913 (with English language translation).

International Preliminary Report on Patentability and Written Opinion issued Apr. 21, 2015 in PCT/JP2013/077913 (with English language translation).

\* cited by examiner

No. 4

×1,500,000

THIN FILM TRANSISTOR

TECHNICAL FIELD

The present invention relates to a thin film transistor (TFT) to be used in display devices such as a liquid crystal display, an organic EL display and the like.

BACKGROUND ART

As compared with widely used amorphous silicon (a-Si), an amorphous (noncrystalline) oxide semiconductor has high carrier mobility, a high optical band gap, and film formability at low temperature and, therefore, has been highly expected to be applied for next generation displays which are required to have a large size, high resolution, and high-speed drive, resin substrates which have low heat resistance, and the like.

Of oxide semiconductors, an amorphous oxide semiconductor containing indium, gallium, zinc, and oxygen (In—Ga—Zn—O, hereinafter also referred to as "IGZO"), and an amorphous oxide semiconductor containing indium, zinc, tin, and oxygen (In—Zn—Sn—O, hereinafter also referred to as "IZTO"), which have a considerably high carrier mobility, is preferably used. For example, Non-Patent Documents 1 and 2 disclose a thin film transistor (TFT) including an IGZO thin film of In:Ga:Zn=1.1:1.1:0.9 (atomic ratio) as a semiconductor layer (active layer).

Furthermore, as cases in which an IZTO thin film is used in a semiconductor layer, Patent Documents 1 and 2, and Non-Patent Documents 3 and 4 can be given. Among these, Patent Document 1 discloses an amorphous oxide (IZTO) containing elements such as In, Zn and Sn; and Mo, wherein an atomic composition ratio of Mo to the total number of all metal atoms in the amorphous oxide is 0.1 to 5 atomic %. Furthermore, a TFT including a thin film of IZTO doped with Mo as an active layer is disclosed in the example of Patent Document 1.

In the above technologies, an amorphous oxide semiconductor is used in the semiconductor layer of the TFT, and it is shown that the use of this amorphous oxide semiconductor permits a TFT having a higher mobility than that using a-Si. In contrast, Patent Document 3 is intended to provide a semiconductor layer having higher mobility by crystallizing an oxide semiconductor by high-temperature firing. Specifically, in Patent Document 3, surface roughness of the semiconductor layer causing a problem of characteristic deterioration at the time of high temperature firing is resolved by controlling a firing temperature. More specifically, a polycrystalline oxide semiconductor thin film containing at least one element in the group consisting of In, Ga and Zn is fired at such a temperature range of 660° C. to 840° C. that the thin film is polycrystallized while maintaining a surface roughness Ra of 1.5 nm or less.

RELATED-ART DOCUMENTS

Patent Documents

Patent Document 1: JP-A-2009-164393
Patent Document 2: JP-A-2008-243928
Patent Document 3: JP-A-2010-177431

Non-Patent Documents

Non-patent Document 1: Kotai Butsuri (Solid State Physics), VOL. 44, P 621 (2009)

Non-patent Document 2: Nature, VOL. 432, P 488 (2004)
Non-patent Document 3: Applied Physics Letters, Vol. 95, 072104 (2009)
Non-patent Document 4: The Proceedings of The 17th International Display Workshops (IDW'10), AMD5/OLED6-2, p 631 (2010)

DISCLOSURE OF THE INVENTION

Problems to be Solved by the Invention

A TFT element generally has a structure in which a passivation layer (in the present invention, in order to distinguish this passivation layer from a passivation layer formed after the formation of a source-drain electrode, the passivation layer formed after the formation of the source-drain electrode is referred to as "surface passivation layer", and the same shall apply hereinafter) is formed to be in direct contact with the oxide semiconductor layer in order to protect against moisture adsorption and the like in the environment. During the formation of this passivation layer, a reaction (interface reaction) occurs at the surface of the oxide semiconductor layer in direct contact with the passivation layer (hereinafter may be referred to as "the interface between the oxide semiconductor layer and the passivation layer"), whereby a protrusion is formed. Therefore, even if the surface roughness of the semiconductor layer after high temperature firing is reduced as described in Patent Document 3, the above reaction occurs in the subsequent step for forming the above passivation layer, whereby a protrusion is formed on the surface of the oxide semiconductor layer. As a result, there are problems such as a decrease of the TFT characteristics due to the formation of carrier traps.

The present invention has been made by focusing on the above situation, and an object of thereof is to implement a TFT in which the shape of the protrusion formed on the interface between the oxide semiconductor layer and the passivation layer is suitably controlled, and hence, the stable characteristics are exhibited.

Means for Solving the Prbolems

A thin film transistor of the present invention which can be solved above problems is a thin film transistor comprising an oxide semiconductor layer formed of an oxide containing at least In, Zn and Sn as metal elements, and a passivation layer in direct contact with the oxide semiconductor layer, wherein a protrusion formed on a surface of the oxide semiconductor layer, the surface being in direct contact with the passivation layer, has a maximum height of less than 5 nm.

A concentration (atomic %) of a metal element in the protrusion is preferably 0.5 to 2.0 times a concentration (atomic %) of a corresponding metal element in the oxide semiconductor layer.

The metal elements preferably comprise In, Zn and Sn. In this case, in all of the In, the Zn and the Sn, a ratio of the In preferably satisfies 5 atomic % or more and 70 atomic % or less, a ratio of the Zn preferably satisfies 30 atomic or more and 85 atomic % or less, and a ratio of the Sn preferably satisfies 50 atomic % or less (excluding 0 atomic %).

The metal elements preferably comprise In, Zn, Sn and Ga. In this case, in all of the In, the Zn, the Sn and the Ga, a ratio of the In preferably satisfies 5 atomic % or more and 70 atomic % or less, a ratio of the Zn preferably satisfies 30 atomic % or more and 85 atomic % or less, a ratio of the Sn preferably satisfies 50 atomic % or less (excluding 0 atomic %), and a ratio of the Ga preferably satisfies 10 atomic % or more and 40 atomic % or less.

The passivation layer preferably comprises a silicon oxide film formed immediately above the oxide semiconductor layer by a CVD method by allowing a gas flow ratio of $SiH_4$ and $N_2O$ ($SiH_4/N_2O$) to be 0.04 or less.

Advantageous Effects of the Invention

According to the present invention, a thin film transistor having excellent TFT characteristics can be provided by suitably controlling the shape of the protrusion formed on the interface between the oxide semiconductor layer and the passivation layer in the TFT.

In the present invention, the "having excellent TFT characteristics" means that particularly, stress stability is excellent, and specifically, a shift amount of threshold voltage ($\Delta V_{th}$) between before and after stress test is less than 15 V.

MODE FOR CARRYING OUT THE INVENTION

Figure 1:
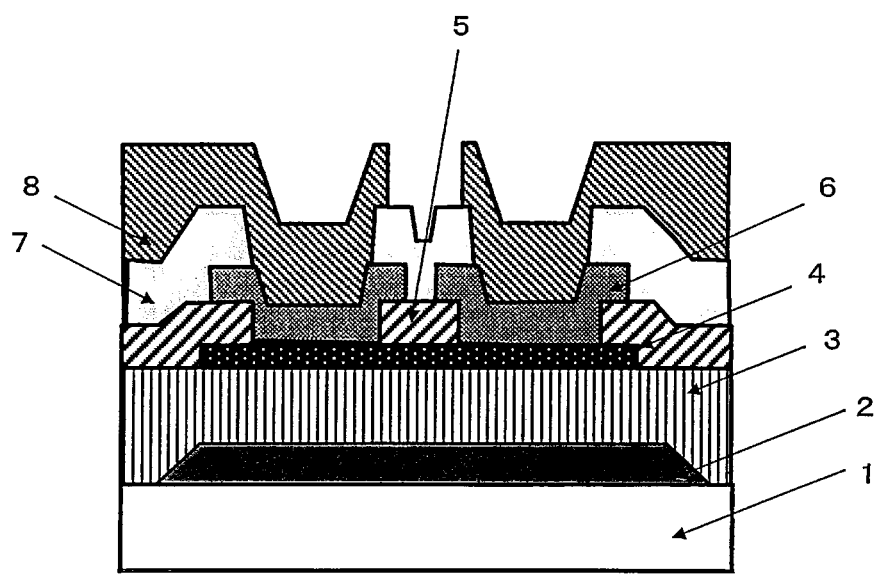
FIG. 1 is a schematic cross-sectional view for illustrating a thin film transistor of the present invention.

The inventors of the present invention made extensive studies to solve the above problems. First, in a TFT having an oxide semiconductor layer formed of an oxide containing at least three elements of In, Zn and Sn, and a passivation layer in direct contact with the oxide semiconductor layer (the passivation layer includes also a layer that functions as an insulator layer, and the same shall apply hereinafter), the inventors focused on that the interface state between the oxide semiconductor layer and the passivation layer seems to exert an influence on the flow of electrons from a source electrode to a drain electrode, and studied the relationship the above interface state and the above flow of electrons.

As described above, when the passivation layer is formed immediately above the oxide semiconductor layer, a protrusion is often produced on the surface of the oxide semiconductor layer in direct contact with the passivation layer. The inventors thought that this protrusion may exert an influence on the above flow of electrons from the source electrode to the drain electrode. Specifically, the inventors thought that a level for trapping carriers is formed due to the formation of this protrusion, and hence, stress stability may decrease. Accordingly, the inventors researched the influence exerted on stress stability by the shape of the protrusion.

As a result, the inventors found that in order to increase stress stability, it is necessary to first control the maximum height of the protrusion, and it is desirable to further control the component composition of the protrusion, and to that end, it is preferable to control the film formation conditions of the passivation layer. The present invention has been made based on this finding.

Below, the present invention will be sequentially explained. First, the maximum height of the protrusion is explained. The inventors found that it is desirable that the maximum height of the protrusion measured by a method described in Examples, given later, be less than 5 nm to obtain excellent stress stability in the present invention. It is assumed that if the maximum height of the protrusion is large, a level for trapping carriers may be easily formed, and hence, stress stability may tend to deteriorate. The above maximum height of the protrusion is preferably 4 nm or less, more preferably 3 nm or less.

Although the above protrusion is formed on the surface of the oxide semiconductor layer, the composition of the protrusion tends to differ from the component composition of the oxide semiconductor layer. The reason why the component composition of the protrusion differs from that of the oxide semiconductor layer is that the above reaction (interface reaction) is caused by the oxidizing powers of elements or the balance of diffusing atoms contained in the oxide semiconductor layer and the passivation layer.

Even when the component composition of the protrusion significantly differs from the component composition of the oxide semiconductor layer, it is considered that a carrier trapping level may be easily formed, resulting in a deterioration in stress stability. Therefore, it is preferable that the component composition of the protrusion be as close as possible to the component composition of the oxide semiconductor layer. Through studies by the inventors, they found that it is preferable that the concentration (atomic %) of a metal element in the protrusion be 0.5 to 2.0 times the concentration (atomic %) of the corresponding metal element in the oxide semiconductor layer. Below, this rate is expressed as a ratio (concentration ratio X) of the concentration (atomic %) of a metal element in the protrusion to the concentration (atomic %) of the corresponding metal element in the oxide semiconductor layer, that is, concentration ratio X=[concentration (atomic %) of metal element in protrusion]/[concentration (atomic %) of metal element in oxide semiconductor layer]. This concentration ratio X of every metal element contained in the protrusion and the oxide semiconductor layer is preferably 0.5 or more (more preferably 0.6 or more, further more preferably 0.8 or more) and preferably 2.0 or less (more preferably 1.8 or less, further more preferably 1.5 or less).

For example, in the case of the oxide semiconductor layer containing the metal elements of In, Zn and Sn, all of the following concentration ratios, which are determined by a method described in Examples given later, are preferably 0.5 or more and 2.0 or less:

concentration ratio $X_{In}$=[concentration (atomic %) of In in protrusion]/[concentration (atomic %) of In in oxide semiconductor layer], concentration ratio $X_{Zn}$=[concentration (atomic %) of Zn in protrusion]/[concentration (atomic %) of Zn in oxide semiconductor layer], and concentration ratio $X_{Sn}$=[concentration (atomic %) of Sn in protrusion]/[concentration (atomic %) of Sn in oxide semiconductor layer].

Moreover, in the case of the oxide semiconductor layer additionally containing a metal element (an additional element, for example, Ga) other than In, Zn and Sn, the concentration ratio expressed as [concentration (atomic %) of above additional element in protrusion]/[concentration (atomic %) of above additional element in oxide semiconductor layer] is also preferably in the above range (0.5 or more and 2.0 or less).

As the passivation layer (the film thickness of about 20 to 200 nm), a silicon oxide film ($SiO_2$ film), a silicon nitride film (SiN film), a silicon oxynitride film (SiON film), a layered film of these, or the like can be formed. Among those, if the silicon oxide film ($SiO_2$ film) is formed as the passivation layer, it is recommended to form by the following manner in order to allow the above maximum height of the protrusion to be 5 nm or less (in order to allow the above protrusion to be formed in a desired shape). Namely, the $SiO_2$ film is generally formed by a CVD method. Specifically, for example, $SiH_4$ and $N_2O$ as reaction gases are allowed to flow into a chamber for film formation, and the components of the above reaction gases are excited and reacted using plasma to form the $SiO_2$ film immediately above the oxide semiconductor layer (on an opposite surface of the oxide semiconductor layer to the substrate side). By changing the gas flow ratio of $SiH_4$ and $N_2O$ used in this film formation, the reacted amount of Si and O changes, and an inclusion of H and a deficiency of O are also caused, whereby a $SiO_2$ film with different film quality is formed.

The inventors focused on that when the $SiO_2$ film is formed as a passivation layer in the above-described manner, it is preferred to control the film formation conditions of this passivation layer to allow the protrusion to form in a desired shape, and further studied. As a result, the inventors found that first, in order to suppress the maximum height of the above protrusion, the amount of $SiH_4$ may be reduced with respect to the amount of $N_2O$, that is, the flow ratio represented by $SiH_4/N_2O$ may be controlled to a certain value or smaller. If the flow ratio is high, the amount of O is reduced with respect to the amount of Si capable of reacting, and hence, it is assumed that dangling bonds may remain in $SiO_2$ and the remained dangling bonds react with a lower oxide (an oxide and the like constituting the oxide semiconductor layer), whereby a protrusion (irregularities at the interface) tends to be produced. Specifically, the inventors found that the flow ratio of $SiH_4/N_2O$ may be 0.04 or less in order to suppress the maximum height of the above protrusion to 5 nm or less. The flow ratio of $SiH_4/N_2O$ is preferably 0.03 or less, more preferably 0.02 or less. In contrast, although a small flow ratio of $SiH_4/N_2O$ is desirable from the viewpoint of suppressing the maximum height of the protrusion, if the flow ratio of $SiH_4/N_2O$ is too small, $SiO_2$ is hardly to be formed, resulting in a lowered film formation rate. Therefore, from the viewpoint of productivity, the flow ratio of $SiH_4/N_2O$ is preferably 0.001 or more.

Moreover, in place of the above $SiO_2$ film, even when a silicon nitride film (SiN film) or a silicon oxynitride film (SiON film) is formed, alternatively, two or more films of the above $SiO_2$ film, SiN film and SiON film are layered, a protrusion similar to that produced in the formation of the $SiO_2$ film may be produced. When a SiN film is formed as a passivation layer, the flow ratio of $SiH_4$ and $N_2+NH_3$ using in the film formation, for example, may be changed in order to suppress the maximum height of the protrusion.

Furthermore, the film formation temperature of the passivation layer may be in a range of about 150 to 250° C.

Moreover, it is assumed that the component composition of the above protrusion, similarly to the shape of the protrusion, is also affected by the flow ratio of $SiH_4/N_2O$. The flow ratio of $SiH_4/N_2O$ seems to be preferably 0.04 or less in order to allow the concentration ratio X of each metal element in the protrusion and the oxide semiconductor layer to be in a range of 0.5 to 2.0 as described above.

The other film formation conditions of the passivation layer are not particularly limited and the conditions commonly used therefor can be adopted. For example, a gas pressure can be 50 to 300 Pa and a film formation power can be 100 to 300 W.

The oxide semiconductor layer may include an oxide containing at least three elements of In, Zn and Sn as metal elements. The oxide semiconductor layer may additionally contain Ga as metal elements. The ratios between respective metal elements (In, Zn, and Sn, and if necessary, further Ga) are not particularly limited as long as they are in a range in which the oxide containing these metals has an amorphous phase and shows semiconductor characteristics.

As for Zn, for example, the ratio of Zn to all the metals (In, Zn and Sn, and if necessary, further Ga) can be 30 atomic % or more and 85 atomic % or less.

The above metals other than Zn (In and Sn, and Ga further contained if necessary) may be appropriately controlled so that Zn is controlled in the above range and the ratio (atomic ratio) of each metal element satisfies a range described later. Specifically, the ratio of In to all the metals (In, Zn and Sn, and Ga further contained, if necessary) is preferably about 5 atomic % or more and 70 atomic % or less, further preferably 30 atomic % or less. The ratio of Sn to all the metals (In, Zn and Sn, and Ga further contained if necessary) is preferably 50 atomic % or less. Furthermore, when Ga is contained, the ratio of Ga to all the metals (In, Zn, Sn and Ga) is preferably 10 to 40 atomic %.

As examples of oxide semiconductors containing the above metals (In, Zn and Sn), In—Zn—Sn—O having an atomic ratio of In:Zn:Sn=1:2:1 can be given.

The above oxide semiconductor layer has a film thickness of about 30 nm or more (preferably 35 nm or more) and about 200 nm or less (preferably 150 nm or less, more preferably 80 nm or less).

A method for forming the above oxide semiconductor layer is not particularly specified and may include, for example, a method for forming a film using a sputtering target by a sputtering method. It is possible to easily form a thin film excellent in film in-plane uniformity of components and film thickness according to the sputtering method.

A TFT according to the present invention is characterized in that the TFT includes the above oxide semiconductor layer and a passivation layer in direct contact with the oxide semiconductor layer, and a protrusion formed on the interface between the oxide semiconductor layer and the passivation layer is controlled as described above. Therefore, the other structures (a substrate, a gate electrode, a gate insulator layer, a source-drain electrode, a surface passivation layer formed on the source-drain electrode, a transparent conductive film, and the like) in the TFT are not particularly specified and may include commonly used structures.

Hereinafter, by referring to FIG. 1, embodiments of a method for producing the above-mentioned TFT will be described. FIG. 1 and the following production method describe one example of preferred embodiments of the present invention, and it is not intended that the present invention be limited thereto. For example, although FIG. 1 shows a TFT with a bottom gate type structure, the embodiments of the present invention are not limited thereto. The present invention can be applied to a top gate type TFT having a gate insulator layer and a gate electrode successively on an oxide semiconductor layer. Specifically, in this top gate type TFT, a protrusion formed on the interface between the above-mentioned oxide semiconductor layer and a passivation layer [a silicon oxide film ($SiO_2$ film), a silicon nitride film (SiN film), a silicon oxynitride film (SiON film) or a layered film of these] in direct contact therewith can be controlled in accordance with the present invention.

As shown in FIG. 1, a gate electrode 2 and a gate insulator layer 3 are formed on a substrate 1, and an oxide semiconductor layer 4 is formed further thereon. A passivation layer [that is also an insulator layer, and for example, a silicon oxide film ($SiO_2$ film) or the like] 5 is formed on the oxide semiconductor layer 4, a source-drain electrode 6 is formed thereon, a surface passivation layer 7 is formed further thereon, and a transparent conductive film 8 is formed at the uppermost surface, wherein the transparent conductive film 8 is electrically connected to the source-drain electrode 6.

A method for forming the gate electrode 2 and the gate insulator layer 3 on the substrate 1 is not particularly limited, and methods commonly used can be adopted. Also, the kinds of the gate electrode 2 and the gate insulator layer 3 are not also particularly limited, and widely used ones can be used. As examples of the gate electrode 2, a thin film of metal such as Al and Cu, a thin film of their alloy, or a Mo thin film used in Examples described later can be given. Also, typical examples of the gate insulator layer 3 include a silicon oxide film ($SiO_2$ film), a silicon nitride film (SiN film), and a silicon oxynitride film (SiON film), and the like.

Next, the oxide semiconductor layer 4 is formed. The oxide semiconductor layer 4 can be formed by a sputtering method as described above. The oxide semiconductor layer 4 is preferable to be formed into a film by a DC sputtering method or an RF sputtering method using a sputtering target with the same composition as that of the above oxide semiconductor layer 4. Alternatively, the oxide semiconductor layer 4 can be formed into a film by a combinatorial sputtering method.

The oxide semiconductor layer 4 is subjected to patterning by photolithography and wet etching. Immediately after the patterning, a heat treatment (pre-annealing) may be carried out, for example, under the conditions of a heating temperature of about 250 to 350° C. (preferably 300 to 350° C.) and a heating time of about 15 to 120 minutes (preferably 60 to 120 minutes) for improving the film quality of the oxide semiconductor layer 4. Accordingly, the ON-current and electron field-effect mobility, which are transistor characteristics, are increased and the transistor performance is improved.

After the above pre-annealing, in order to protect the surface of the above oxide semiconductor layer 4, a silicon oxide film ($SiO_2$ film) may be formed as a passivation layer 5 by the above-mentioned method.

Next, patterning is performed by photolithography and dry etching in order to make a contact between the oxide semiconductor layer 4 and a source-drain electrode 6 to be formed next.

Then, the source-drain electrode 6 is formed. The kinds of the source-drain electrode 6 are not particularly limited and widely used ones can be used. For example, similarly to the gate electrode 2, metals such as Al and Cu and their alloys may be used, or a Mo thin film may be used as in Examples described later.

A method for forming the source-drain electrode 6 may be carried out, for example, by forming a metal thin film by a magnetron sputtering method and then forming the metal thin film into the source-drain electrode 6 by a lift-off method.

Next, the surface passivation layer (insulator layer) 7 is formed on the above source-drain electrode 6. The surface passivation layer 7 can be formed, for example, by a CVD method. As the surface passivation layer 7, a silicon oxide film ($SiO_2$ film), a silicon nitride film (SiN film), a silicon oxynitride film (SiON film), and a layered film of these film can be given.

Next, after a contact hole in the surface passivation layer 7 is formed by photolithography and dry etching, the transparent conductive film 8 is formed. The kinds of the transparent conductive film 8 are not particularly limited, and commonly used ones can be used.

This application claims the benefits of priority to Japanese Patent Application No. 2012-231805 filed on Oct. 19, 2012. The entire content of the specification of Japanese Patent Application No. 2012-231805 filed on Oct. 19, 2012 is incorporated herein by reference.

EXAMPLES

Below, by way of examples, the present invention will be more specifically described. However, the present invention is not limited by the following examples. It is naturally understood that modifications may be properly made and practiced within the scope adaptable to the meaning described above and below. All of these are included in the technical scope of the present invention.

First, a Mo thin film (film thickness 100 nm) was formed as a thin film for a gate electrode on a glass substrate (EAGLE XG manufactured by Corning Incorporated, diameter 100 mm×thickness 0.7 mm), and patterning was carried out by a known method to obtain a gate electrode. The film formation of the Mo thin film was carried out using a pure Mo sputtering target by a DC sputtering method under the conditions as follows: film formation temperature: room temperature, film formation power: 300 W, carrier gas: Ar, and gas pressure: 2 mTorr.

Next, a $SiO_2$ film (200 nm) was formed as a gate insulator layer. This gate insulator layer was formed by a plasma CVD method under the conditions as follows: carrier gas: mixed gas of $SiH_4$ and $N_2O$, film formation power: 100 W, and film formation temperature: 300° C.

Next, an IZTO thin film (the composition is In:Zn:Sn=20:53:27) as an oxide semiconductor layer (film thickness 40 nm) was formed using an IZTO sputtering target by a sputtering method under the following conditions.
(Film Formation Conditions of IZTO Thin Film)
  Sputtering apparatus: "CS-200" manufactured by ULVAC, Inc.
  Substrate temperature: room temperature
  Gas pressure: 1 mTorr
  Oxygen partial pressure: $[O_2/(Ar+O_2)]\times 100=4\%$ After the oxide semiconductor layer was thus formed as above, patterning was performed by photolithography and wet etching. The wet etchant used was "ITO-07N" (mixed solution of oxalic acid and water) manufactured by Kanto Chemical Co., Inc., and the solution temperature was 40° C.

After patterning of the oxide semiconductor layer was performed as described above, a pre-annealing treatment was performed to improve the film quality of the oxide semiconductor layer. The pre-annealing treatment was performed in moisture vapor under atmospheric pressure at 350° C. for one hour.

Next, a $SiO_2$ film (film thickness 100 nm) was formed as a passivation layer to protect the surface of the above IZTO thin film (oxide semiconductor layer). This $SiO_2$ film was formed using "PD-220NL" manufactured by SAMCO Inc. by a plasma CVD method. In this Example, the film formation was performed using a mixed gas of $N_2O$ and $SiH_4$ under the conditions shown in the following and in Table 3.
(Film Formation Conditions of Passivation Layer)
  Film formation temperature: 150° C., 200° C.
  Gas pressure: 133 Pa
  Film formation power: 100 W
  Flow ratio of $SiH_4/N_2O$: 0.003, 0.04, 0.06

The passivation layer was subjected to patterning by photolithography and dry etching to make a contact between the oxide semiconductor layer and a source-drain electrode.

Next, the source-drain electrode was formed by a lift-off method. Specifically, after patterning was carried out using a photoresist, a Mo thin film was formed by a DC sputtering method (film thickness 100 nm). A method for forming the Mo thin film for the source-drain electrode is the same as that in the case of the gate electrode described above. Next, an unnecessary photoresist was removed by dipping in an acetone solution with an ultrasonic washing apparatus to give TFT with a channel length of 10 μm and a channel width of 200 μm.

After the source-drain electrode was formed, a surface passivation layer was formed. As the surface passivation layer, a layered film (total film thickness 250 nm) of a $SiO_2$ film (film thickness 100 nm) and a SiN film (film thickness 150 nm) was formed. The above-mentioned $SiO_2$ film and SiN film were formed using "PD-220NL" manufactured by SAMCO Inc. by a plasma CVD method. In this Example, the $SiO_2$ film and the SiN film were successively formed. A mixed gas of $N_2O$ and $SiH_4$ was used for the formation of the $SiO_2$ film and a mixed gas of $SiH_4$, $N_2$ and $NH_3$ was used for the formation of the SiN film. In both cases, the film formation power was set to 100 W and the film formation temperature was set to 150° C.

Next, a contact hole for probing for evaluating transistor characteristics was formed in the surface passivation layer by photolithography and dry etching.

Using the TFT elements obtained as described above, the protrusions and the transistor (TFT) characteristics were evaluated as follows.

(1) Evaluation of Protrusion
(1-1) Maximum Height of Protrusion

Each of the TFT elements was processed so as to be able to observe a cross section in a direction of film thickness including the interface between the oxide semiconductor layer and the passivation layer in direct contact with this oxide semiconductor layer in the TFT element. This processing was carried out with an FIB (Focused Ion Beam), specifically a Ga Ion Beam.

A sample for observation having the above-mentioned processing area of a length of about 1 to 2 μm in the interface direction was roughly observed first by a TEM at a low magnification (×150,000), and a portion of the interface which appears rough was further observed at a high magnification (×1,500,000) to confirm the presence or absence of protrusions and the size of protrusions. Specifically, in the observation image (TEM image), a portion where a convex was formed was judged as a "protrusion" without reflecting waviness of a underlying film (gate insulator layer or the like) in contact with the oxide semiconductor layer, and a difference between the highest point of this convex portion and the lowest point of the interface (line) between the above oxide semiconductor layer and the above passivation layer in view is taken as "the maximum height of the protrusion" (when the underlying film of the oxide semiconductor layer on which the convex portion was formed had waviness, the lowest point was determined after deducting the height and depth of the waviness).

The maximum heights of the protrusions were determined in the above-mentioned manner and evaluated according to the following judgment criteria. In this Example, the cases judged as ○ or Δ were evaluated as having a good interface state between the oxide semiconductor layer and the passivation layer.

(Judgment Criteria)
○ . . . The maximum height of the protrusion is less than 2 nm.
Δ . . . The maximum height of the protrusion is 2 nm or more and less than 5 nm.
× . . . The maximum height of the protrusion is 5 nm or more.

(1-2) Component Composition of Protrusion

Each content of In, Sn and Zn contained in a central part of film thickness of the oxide semiconductor layer in the above-mentioned cross section and the protrusion was measured by EDX (Energy Dispersive X-ray Spectroscopy). The concentration of each metal element (ratio to all of the metal elements) was calculated using the following expressions (1) to (3).

$$\text{Concentration of In (atomic \%)} = [\text{In}/(\text{In}+\text{Sn}+\text{Zn})] \times 100 \quad (1)$$

$$\text{Concentration of Sn (atomic \%)} = [\text{Sn}/(\text{In}+\text{Sn}+\text{Zn})] \times 100 \quad (2)$$

$$\text{Concentration of Zn (atomic \%)} = [\text{Zn}/(\text{In}+\text{Sn}+\text{Zn})] \times 100 \quad (3)$$

[On the right sides in the above expressions (1) to (3), In, Sn and Zn show the respective contents (atomic %) of In, Sn and Zn contained in the central part of film thickness of the oxide semiconductor layer or the protrusion.]

Then, the concentration ratio $X_{In}$ [=(concentration of In in protrusion)/(concentration of In in oxide semiconductor layer)], the concentration ratio $X_{Zn}$ [=(concentration of Zn in protrusion)/(concentration of Zn in oxide semiconductor layer)], and the concentration ratio $X_{Sn}$ [=(concentration of Sn in protrusion)/(concentration of Sn in oxide semiconductor layer)] were determined, and the component composition of each protrusion was evaluated according to the following judgment criteria. In this Example, the cases judged as OK were evaluated to be passing.

(Judgment Criteria)
OK . . . Each of concentration ratio $X_{In}$, concentration ratio $X_{Zn}$ and concentration ratio $X_{Sn}$ is 0.5 or more and 2.0 or less.
NG . . . At least one of concentration ratio $X_{In}$, concentration ratio $X_{Zn}$ and concentration ratio $X_{Sn}$ is less than 0.5 or more than 2.0.

Figure 2:
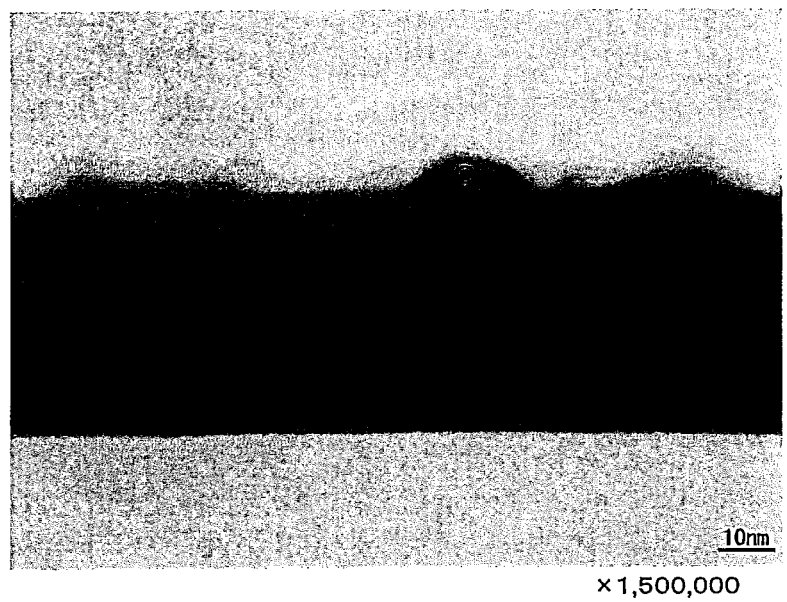
FIG. 2 is a TEM micrograph of No. 3 in Table 3 in Examples.
Figure 3:
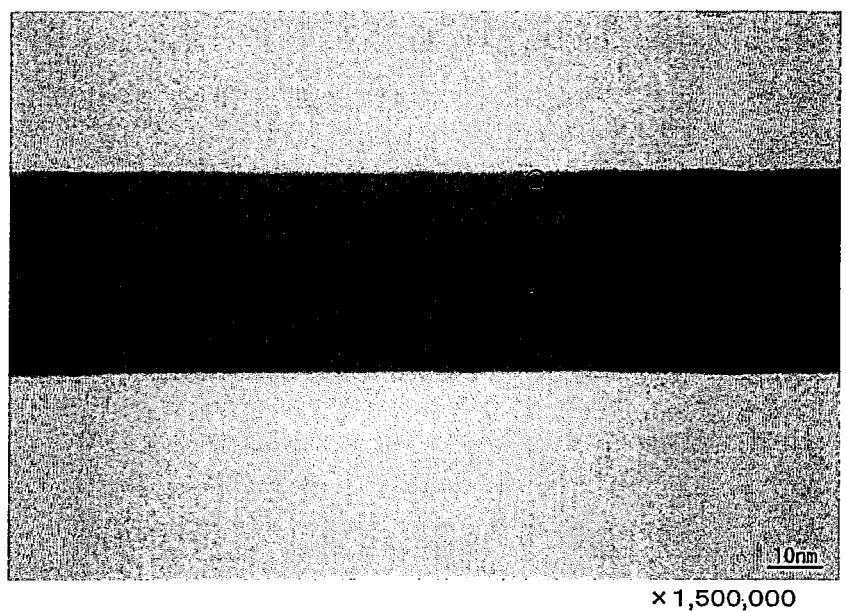
FIG. 3 is a TEM micrograph of No. 4 in Table 3 in Examples.

For reference, the measurement results of No. 3 and No. 4 in Table 3 described later are shown in FIG. 2 and FIG. 3, respectively. FIG. 2 is a TEM micrograph showing analysis positions of the concentrations of the metal elements of No. 3, and in this micrograph, ○ shows the analysis position of the protrusion and Δ shows the analysis position of the central part of film thickness of the oxide semiconductor layer. The measurement results of the component composition at each analysis position are shown in Table 1.

TABLE 1

| No. 3 | In | Zn | Sn |
|---|---|---|---|
| Concentration (at %) of metal element in protrusion (○ in the micrograph) | 41.5 | 11.6 | 46.9 |
| Concentration (at %) of metal element in oxide semiconductor layer (Δ in the micrograph) | 25.0 | 48.2 | 26.9 |
| Concentration ratio X (Concentration of metal element in protrusion)/ (Concentration of metal element in oxide semiconductor layer) | $X_{In}$ 1.7 | $X_{Zn}$ 0.2 | $X_{Sn}$ 1.7 |

As shown in Table 1, both of the concentration ratio $X_{In}$ and the concentration ratio $X_{Sn}$ of No. 3 are 1.7, which are in the range of the desired ratio (0.5 or more and 2.0 or less). However, the concentration ratio $X_{Zn}$ of No. 3 is 0.2, which is below the range of the above ratios (0.5 or more and 2.0 or less). Therefore, No. 3 is judged as NG in "Judgment of concentration ratio X" in Table 3 given later.

FIG. 3 is a TEM micrograph showing analysis positions of the concentrations of the metal elements of No. 4, and in this micrograph, ○ shows the analysis position of the protrusion and Δ shows the analysis position of the central part of film thickness of the oxide semiconductor layer. It is noted that in No. 4, there were few observable protrusions as shown in FIG. 3, the surface (interface) of the oxide semiconductor layer in direct contact with the passivation layer was analyzed. The measurement results of the component composition at each analysis position are shown in Table 2.

TABLE 2

| No. 4 | In | Zn | Sn |
|---|---|---|---|
| Concentration (at %) of metal element in protrusion (○ in the micrograph) | 27.4 | 47.8 | 24.8 |
| Concentration (at %) of metal element in oxide semiconductor layer (Δ in the micrograph) | 26.5 | 49.5 | 24.0 |
| Concentration ratio X (Concentration of metal element in protrusion)/ (Concentration of metal element in oxide semiconductor layer) | $X_{In}$ 1.0 | $X_{Zn}$ 1.0 | $X_{Sn}$ 1.0 |

As shown in Table 2, all of the concentration ratio $X_{In}$, the concentration ratio $X_{Zn}$ and the concentration ratio $X_{Sn}$ of No. 4 are in the range of the desired ratio (0.5 or more and 2.0 or less). Therefore, No. 4 is judged as OK in "Judgment of concentration ratio X" in Table 3 given later.

As for also the other examples in Table 3, each concentration ratio X (concentration ratio $X_{In}$, concentration ratio $X_{Zn}$ and concentration ratio $X_{Sn}$) was determined in the same manner as No. 3 and No. 4 described above and the judgment was conducted. The results are shown in Table 3.

(2) Evaluation of TFT Characteristics

Next, the transistor characteristics (drain current-gate voltage characteristics and $I_d$-$V_g$ characteristics), threshold voltage, electron field-effect mobility and stress stability were examined as follows.

(2-1) Measurement of Transistor Characteristics

The transistor characteristics (TFT characteristics) were measured using a semiconductor parameter analyzer "4156C" manufactured by Agilent Technologies. The measurement was conducted so that a probe was connected to a contact hole of the sample. The detailed measurement conditions were as follows.
Source voltage: 0 V
Drain voltage: 10 V
Gate voltage: −30 to 30 V (measurement interval: 0.25 V)
Substrate temperature: room temperature (2-2) Threshold Voltage ($V_{th}$)

Roughly speaking, the threshold voltage is a value of gate voltage at the time when a transistor is shifted from OFF state (state where drain current is low) to ON state (state where drain current is high). In this example, the voltage in the case where the drain current is nearly 1 nA between ON-current and OFF-current is defined as the threshold voltage, and the threshold voltage of each TFT was measured. In this example, the pass criterion was that $V_{th}$ (absolute value) was 5 V or less. These results are shown in Table 3.

(2-3) Electron Field-Effect Mobility $\mu_{FE}$

The electron field-effect mobility $\mu_{FE}$ was derived from the TFT characteristics in a saturation region of $V_d > V_g - V_{th}$. The $\mu_{FE}$ was derived from the following expression (4), where in the saturation region, $V_g$ and $V_{th}$ are a gate electrode and a threshold voltage, respectively, $I_d$ is a drain current, L and W are a channel length of the TFT element and a channel width of the TFT element, respectively, $C_i$ is an electrostatic capacitance of the gate insulator layer, and $\mu_{FE}$ is an electron field-effect mobility. In this Example, the electron field-effect mobility $\mu_{FE}$ (shown as "Mobility" in Table 3) was derived from drain current-gate voltage characteristics ($I_d$-$V_g$ characteristics) nearly at a gate voltage satisfying the saturation region. The pass criterion was that the mobility was 10 cm²/Vs or more.

The results are shown in Table 3.

[Math 1]

$$\mu_{FE} = \frac{\partial I_d}{\partial V_g}\left(\frac{L}{C_i W(V_g - V_{th})}\right) \quad (4)$$

(2-4) Evaluation of Stress Stability (Light Irradiation and Negative Bias Application as Stress)

In this Example, stress tests were carried out by irradiation of light while applying negative bias to a gate electrode for simulation of environments (stress) at the time of actual panel drive. The stress test conditions were as follows. A light wavelength with about 400 nm was selected which was close to the band gap of an oxide semiconductor and with which the transistor characteristics tend to be easily fluctuated.

(Test Conditions)
Gate voltage: −20 V
Substrate temperature: 60° C.
Light stress conditions
Wavelength: 400 nm
Illuminance (light intensity for irradiation to TFT): 0.1 µW/cm²
Light source: LED manufactured by OPTOSUPPLY Limited (light quantity was adjusted by an ND filter)
Stress tests time: 2 hours The threshold voltages ($V_{th}$) before and after the stress tests were measured using the technique described above, and a difference therebetween ($\Delta V_{th}$) was determined. $\Delta V_{th}$ calculated in this manner was evaluated using the following judgment criteria. In this Example, the case judged as OK was evaluated as being excellent in stress stability. The results were shown in Table 3.

(Judgment Criteria)
OK . . . $\Delta V_{th}$ (absolute value) is less than 15 V
NG . . . $\Delta V_{th}$ (absolute value) is 15 V or more

TABLE 3

| No. | (SiH₄/N₂O) ratio | Film formation temperature of passovation layer (° C.) | Maximum height of protrusion | Judgment of concentration ration X | $V_{th}$ (V) | Mobility (cm²/Vs) | $\Delta V_{th}$ (V) | Stress stability |
|---|---|---|---|---|---|---|---|---|
| 1 | 0.003 | 200 | ○ | OK | 4 | 20 | 1.25 | OK |
| 2 | 0.04 | 200 | ○ | OK | 1 | 15.97 | 1 | OK |
| 3 | 0.06 | 150 | X | NG | −1.25 | 16.91 | 15.2 | NG |
| 4 | 0.04 | 150 | ○ | OK | 1 | 17.96 | 1.75 | OK |

The following can be considered from Table 3. As is clear from the comparison of Nos. 1, 2 and 4 with No. 3, no difference in characteristics ($V_{th}$ and mobility) therebetween was observed in the state where stress was not applied, whereas when stress was applied, Nos. 1, 2 and 4 in which the maximum height of the protrusion and the like had been controlled had a smaller $\Delta V_{th}$ than that of No. 3, and are excellent in stress stability.

EXPLANATION OF REFERENCE NUMERALS

1 Substrate
2 Gate electrode
3 Gate insulator layer
4 Oxide semiconductor layer
5 Passivation layer ($SiO_2$ film)
6 Source-drain electrode
7 Surface passivation layer (insulator layer)
8 Transparent conductive film

The invention claimed is:

1. A thin film transistor comprising an oxide semiconductor layer formed of an oxide containing at least In, Zn and Sn as metal elements, and a passivation layer in direct contact with the oxide semiconductor layer,
   wherein a protrusion formed on a surface of the oxide semiconductor layer, the surface being in direct contact with the passivation layer, has a maximum height of less than 5 nm, wherein a concentration (atomic %) of a metal element in the protrusion is 0.5 to 2.0 times a concentration (atomic %) of a corresponding metal element in the oxide semiconductor layer.

2. The thin film transistor according to claim 1, wherein the metal elements comprise In, Zn and Sn.

3. The thin film transistor according to claim 2, wherein in all of the In, the Zn and the Sn,
   a ratio of the In satisfies 5 atomic % or more and 70 atomic % or less,
   a ratio of the Zn satisfies 30 atomic % or more and 85 atomic % or less, and
   a ratio of the Sn satisfies 50 atomic % or less, excluding 0 atomic %.

4. The thin film transistor according to claim 1, wherein the metal elements comprise In, Zn, Sn and Ga.

5. The thin film transistor according to claim 4, wherein in all of the In, the Zn, the Sn and the Ga,
   a ratio of the In satisfies 5 atomic % or more and 70 atomic % or less,
   a ratio of the Zn satisfies 30 atomic % or more and 85 atomic % or less,
   a ratio of the Sn satisfies 50 atomic % or less, excluding 0 atomic %, and
   a ratio of the Ga satisfies 10 atomic % or more and 40 atomic % or less.

6. The thin film transistor according to claim 1, wherein the passivation layer comprises a silicon oxide film formed immediately above the oxide semiconductor layer by a CVD method by allowing a gas flow ratio of $SiH_4$ and $N_2O$ ($SiH_4/N_2O$) to be 0.04 or less.

* * * * *